(12) United States Patent
Naiini et al.

(10) Patent No.: US 6,511,789 B2
(45) Date of Patent: Jan. 28, 2003

(54) PHOTOSENSITIVE POLYIMIDE PRECURSOR COMPOSITIONS

(75) Inventors: Ahmad Naiini, Warwick, RI (US); Donald Racicot, Providence, RI (US); Andrew J. Roza, Barrington, RI (US); William D. Weber, Cranston, RI (US); Pamela J. Waterson, Northbridge, MA (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 42 days.

(21) Appl. No.: 09/886,626

(22) Filed: Jun. 20, 2001

(65) Prior Publication Data

US 2002/0025494 A1 Feb. 28, 2002

Related U.S. Application Data

(60) Provisional application No. 60/214,092, filed on Jun. 26, 2000.

(51) Int. Cl.[7] .................................................. G03F 7/004
(52) U.S. Cl. .................................. 430/283.1; 430/270.1; 430/281.1; 522/27; 522/29
(58) Field of Search ......................... 430/270.1, 281.1, 430/914, 283.1; 522/27, 29

(56) References Cited

U.S. PATENT DOCUMENTS

| | | |
|---|---|---|
| 4,040,831 A | 8/1977 | Rubner et al. |
| 4,548,891 A | 10/1985 | Riediker et al. |
| 5,399,460 A | 3/1995 | Aldrich et al. |
| 5,834,581 A | 11/1998 | Naiini et al. |
| 6,010,825 A | 1/2000 | Hagen et al. |

*Primary Examiner*—Rosemary Ashton
(74) *Attorney, Agent, or Firm*—Ohlandt, Greeley, Ruggiero & Perle, LLP

(57) ABSTRACT

Reducing inhibition of the photochemical crosslinking by including in the photosensitive polyimide precursor composition a metal inhibitor selected from 1H-tetrazole, 1,2-cyclohexenediamine tetraacetic acid hydrate and 5-mercaptobenzimidazole.

5 Claims, No Drawings

PHOTOSENSITIVE POLYIMIDE PRECURSOR COMPOSITIONS

This application claims the benefit of Provisional application Ser. No. 60/214,092, filed Jun. 26, 2000, now abandoned.

FIELD OF THE INVENTION

The present invention relates to photosensitive polyimide precursor compositions useful for forming relief structures on silicon, glass, ceramic, or polymer substrates bearing copper or silver circuitry. The photosensitive compositions according to this invention are especially suitable for applications in microelectronics.

BACKGROUND TO THE INVENTION

Negative tone photosensitive polyimide precursors based on polyamic esters containing radiation sensitive groups in the ester moiety are well known (U.S. Pat. Nos. 4,040,831, 4,548,891, 6,010,825). When these polymers are formulated with a radical photoinitiator and a cross-linking agent in a suitable solvent, the resulting material may be processed as a negative tone photoresist. The photoimaging and processability of these resist compositions may be modified by adding to the formulation one or more compounds such as adhesion promoters, photosensitizers, dyes, leveling agents, and viscosity stabilizing agents. Many formulations of this type are known and are widely used in the microelectronic industry. Microelectronic applications include, but are not limited to, stress relief layers for packaged microelectronic devices, protective coatings, alpha particle barrier coatings, and as dielectric layers. Substrate materials that have been processed with photosensitive polyimide coatings include silicon device wafers, ceramics, glass, flexible polymer-metal foils, and the like.

In use, the polyamic ester formulations are coated as a film on a substrate using any of a variety of coating methods including spin, dip, spray, roller, meniscus, extrusion, and curtain coating. The resulting wet film is heated at temperatures ranging from 50 to 150° C. to provide a tack-free or "softbaked" film. The softbaked film is then exposed to the action of actinic rays at wavelengths ranging from 350 to 450 nanometers through a photomask. Such actinic rays are commonly obtained from the mercury lamp whose most useful rays are the i-line at 365 nanometers and the g-line at 436 nanometers. The actinic rays interact with the photoinitiator in a photochemical reaction to produce an organic radical that initiates a radical cross-linking reaction of the unsaturated groups of the polyamic ester and the crosslinking agent. The products of this reaction have decreased solubility in certain solvents. Thus, treatment of the exposed film with an appropriate solvent results in the removal of unexposed areas and the retention of exposed areas to form a relief pattern of the mask in the film. After image development, the patterned polyamic ester film is converted to a patterned polyimide film by the means of applying heat at temperatures ranging from 200° C. to 450° C. for a period of time ranging from thirty minutes to six hours.

The efficacy of the photochemical cross linking reaction in producing an insoluble product is known to be adversely affected by the presence of chemicals that react with the radicals produced by the photoinitiator in such a manner as to prevent or inhibit the cross linking of the polymer. When crosslinking inhibition occurs, the relief image is damaged or lost during the image development process and film loss during development is high. A well-known example of such an inhibitor is the oxygen molecule, which inhibits the photocrosslinking of polyamic acrylate esters and is well known as an inhibitor toward the radical polymerization of acrylate and acrylate derivatives. Inhibition of crosslinking also occurs when photosensitive polyimide precursor formulations containing certain organotitanocene photoinitiators are processed on substrates wherein copper and silver metal layers are present. Lowering the softbake temperature of the spin applied coating can lessen the undesirable inhibition effects on copper and silver layers. However, this approach decreases pattern resolution and results in unacceptably fast photospeeds and increased film loss. The increased industrial use of copper and silver metal as the conductor in microelectronic devices, sensors, packages, and flexible circuit elements has created a need for formulations with improved performance where copper and silver layers are present.

SUMMARY OF THE INVENTION

It is the object of the present invention to provide a negative working photosensitive polyimide precursor formulation whose photoimaging function is not inhibited when the composition is applied to and processed on copper or silver bearing substrates. The photosensitive composition of this invention consists of a polyamic ester polymer containing ethylenically unsaturated groups, a photo-crosslinking additive, a photoinitiator, a metal inhibitor, a polymerization inhibitor, and a solvent. Optionally and in addition to the aforementioned components, the composition may contain one or more photosensitizers, adhesion promoters, and dyes.

The photosensitive compositions can be used in the manufacture of microelectronic devices and in electronic applications such as thermal and mechanical stress buffer coatings, alpha particles barrier coatings, interlayer dielectric films, and as patterned engineering plastic layers.

DETAILED DESCRIPTION OF THE INVENTION

One aspect of the present invention is to provide a photosensitive polyimide precursor composition comprising:

(i) 20–50 parts by weight of a polyamic ester polymer (C) obtained by the polycondensation of a diester-diacid chloride compounds (A) with a diamine compound (B).
(ii) 1–4 parts by weight of a photoinitiator (D).
(iii) 3–10 parts by weight of a photocrosslinkable additive (E).
(iv) 0.005–1 parts by weight of a metal inhibitor (F).
(v) 0.01–1 parts by weight of a polymerization inhibitor (G).
(vi) 44–76 parts by weight of a solvent (H).

Optionally and in addition to components A and D through H inclusively, the composition may contain one or more of the following components:

(vii) 0.1–2.0 parts by weight of one or more photosensitizer compounds (I).
(viii) 0.05–2.0 parts by weight of an adhesion promoting compound (J).

The polyamic ester polymer (C) has a number average degree of polymerization of 5 to 100 and is synthesized by the polycondensation of monomers A and B as follows (1):

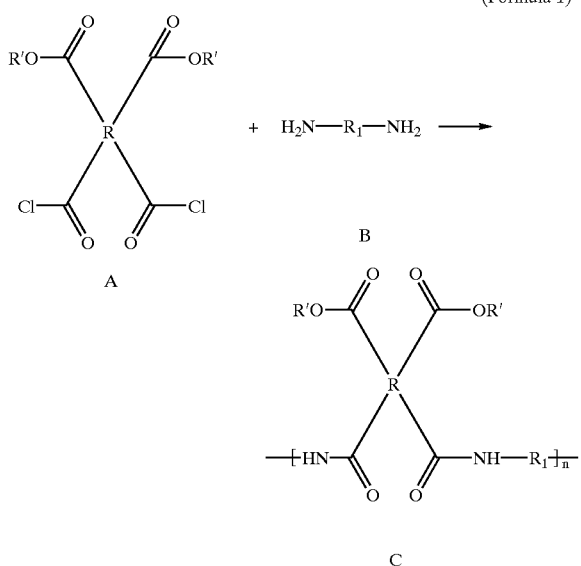

(Formula 1)

Monomer A is obtained by the reaction of a dianhydride compound with at an alcohol, R'OH, to yield a diester-diacid followed by conversion of the diacid-diester to a diester-diacid chloride by means of a suitable reagent (Formula 2).

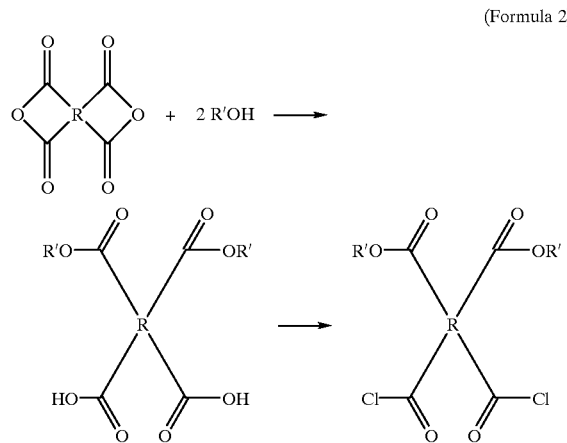

(Formula 2)

The group R represents a tetravalent aromatic group containing at least one 6-membered carbon ring wherein the four carbonyl groups are directly connected to is different carbon atoms of R and wherein each of two pairs of the four carbonyl groups is connected to adjacent carbon atoms. The dianhydride compound may be selected from one or more of the following dianhydrides: pyromellitic dianhydride (PMDA), 3,3', 4,4'-benzophenonetetracarboxylic dianhydride (BTDA), 3,3', 4,4'-biphenyltetracarboxylic dianhydride (BPDA), 3,3', 4,4'-diphenylsulfonetetracarboxylic dianhydride, 4,4'-perfluoroisopropylidinediphthalic dianhydride (6FDA), 4,4'-oxydiphthalic anhydride (ODPA), bis (3,4-dicarboxyl) tetramethyldisiloxane dianhydride, bis(3,4-dicarboxylphenyl)dimethylsilane dianhydride, cyclobutane tetracarboxylic dianhydride, and 1,4,5,8-naphthalenetetracarboxylic dianhydride. The tetracarboxylic dianhydrides can be used singly or in combination and selection of the dianhydride compound is not limited to the compounds listed above. The group R' contains at least one unsaturated group which may be a vinyl, allyl, acrylyl, methacryl, acetylenic, a cyano group, or other suitable radiation crosslinkable group.

Monomer B is an divalent diamine wherein the group $R_1$ contains at least one 6-membered carbon ring and is selected from at least one the following group of divalent aromatic, heterocyclic, alicyclic or aliphatic amines: m-phenylenediamine, p-phenylenediamine, 2,2'-bis (trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis (4-aminophenoxy) benzene, 1,3-bis(3-aminophenoxy) benzene, 1,4-bis (γ-aminopropyl) tetramethyldisiloxane, 2,3,5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethylenediamine, 3-methoxyhexamethylenediamine, heptamethylenediamine, 2,5-dimethylheptamethylenediamine, 3-methylheptamethylenediamine, 4,4-dimethylheptamethylenediamine, octamethylenediamine, nonamethylenediamine, 2,5-dimethyinonamethylenediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, 3,3'-diaminodiphenylethne, 4,4'-diaminodiphenylethylene, and 4,4'-diaminodiphenyl sulfide, 2,6-diaminopyridine, 2,5-diaminopyridine, 2,6-diamino-4-trifluoromethylpyridine, 2,5-diamino-1,3,4,-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'sulfonyl-dianiline, 3,3'sulfonyl-dianiline. The selection of monomer B is not restricted to these compounds and the monomers B can be used singly or in combination.

Photoinitiator D is selected from at least one of the group consisting of.

Formula 3

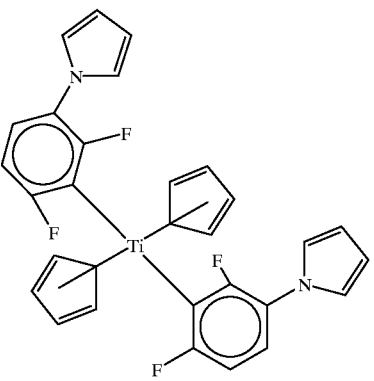

Formula 4

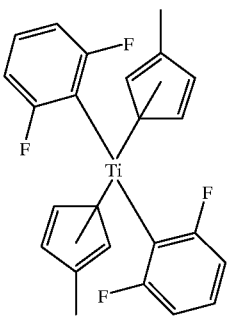

namely, bis(.eta. 5-2,4-cyclopentadien-1-yl)-bis(2,6-difluoro-3-(1H-pyrrol-1-yl)phenyl) titanium and bis(methylcyclopentadienyl)-bis(2,6-difluorophen-1-yl) titanium.

Photocrosslinking agent (E) is selected from at least one of the group consisting of esters and partial esters of acrylic acid or methacrylic acid and aromatic and particularly aliphatic polyols with 2–30 C-atoms or cycloaliphatic polyols with 5 or 6 C-atoms. Examples of suitable components (E) are: ethylene glycol diacrylate, ethylene glycol dimethacrylate, diethylene glycol diacrylate, diethylene glycol dimethacrylate, triethylene glycol diacrylate, triethylene glycol dimethacrylate, tetraethylene glycol diacrylate, tetraethylene glycol dimethacrylate, polyethylene glycol di(meth)acrylates with an average molecular weight in the range of 200–2000, trimethylolpropane ethoxylate tri(meth)acrylates with an average molecular weight in the range of 500–15000, pentaerythrite tri(meth)acrylate, pentaerythrite di(meth)acrylate, pentaerythrite tetra (meth)acrylate, and the like.

The metal inhibitor compound (F) is selected from at least one of the group consisting of: 1H-tetrazole, 1,2-cyclohexanediamine tetraacetic acid hydrate, and 5mercaptobenzimidazole.

The polymerization inhibitor (G) is selected from the group consisting of para-benzoquinone, thiodiphenylamine, and alkyl phenols such as 4-tert-butylphenol, 2,5-di-tert-butyl hydroquinone, or 2,6-di-tert-butyl-4-methylphenol.

The solvent (H) is selected from the group consisting of 2-methylpyrrolidone, γ-butyrolactone, N,N-dimethylformamide, N,N-dimethylacetamide, dimethylsufoxide, sulfolane, ethylene glycol monomethyl ether, cyclopentanone, propylene glycol monomethyl ether acetate, and tetrahydrofuran. These solvents may be used separately or as mixtures.

The compositions embraced by this invention may optionally contain one or more of the following components in addition to polymer A and components D through H.

One or more photosensitizers (I) selected from the group consisting of coumarins of Formula 5

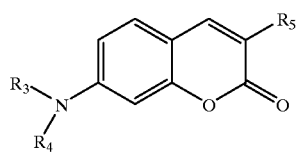

(Formula 5)

in which $R_3$ and $R_4$, independent of one another, are $C_1$–$C_6$ alkyl groups and $R_5$ indicates $C_1$–$C_6$ alkylcarbonyl, $C_1$–$C_6$ alkoxycarbonyl, $C_6$–$C_{14}$ arylcarbonyl, or $C_6$–$C_{14}$ aryloxycarbonyl, optionally substituted with $C_{1-6}$ dialkylamino substituents.

One or more adhesion promoting compounds (J) selected from the group consisting of aminoalkoxysilanes and derivatives of aminoalkoxysilanes.

The formulated compositions may also contains additives such as pigments, colorants, fillers, adhesives, wetting agents, and dyes that can influence the spectral sensitivity of the mixtures by their intrinsic absorption.

As the first step in applying the photosensitive polyimide precursors compositions embraced by this invention, the photosensitive composition is coated on a substrate such as a silicon device wafer, a ceramic substrate, a flexible polymer substrate, and the like which may have copper or silver metal films coated or attached to them by means of an adhesive. Coating methods suitable for use include but are not limited to spin coating, roller coating, offset printing, screen printing, extrusion coating, meniscus coating, curtain coating, dip coating, and spray coating. The resulting wet coating is dried or softbaked at a temperature of 70 to 150° C. using a hot plate, convection oven, belt furnace, and the like for a period of several minutes to twelve hours depending on the coating method and film thickness. The dried coating is exposed to actinic rays through a mask pattern in a manner such that an image of the mask pattern is formed in the dried film. Examples of actinic rays useful in the practice of this invention are x-rays, electron beams, ultraviolet rays, and visible light rays. The most preferred rays are those with wavelengths of 365 nanometers and 436 nanometers and are readily obtained from mercury lamp sources.

In the next step, the imaged film is developed to form a relief image of the mask pattern by treating the exposed film with an appropriate solvent. Examples of solvents useful in the practice of this invention include but are not limited to γ-butyrolactone, 2-methylpyrollidone, n-butyl acetate, ethyl lactate, cyclopentanone, cyclohexanone, propylene glycol monomethyl ether acetate, isopropanol and binary or ternary mixtures thereof. Image development can be carried out by means of immersion, spray, puddle, spray-puddle, or similar means known in the photoresist art. The developed relief pattern is rinsed with a solvent suitable for removal of the developer solvent. Rinse solvents useful in the practice of this invention include but are not limited to n-butyl acetate, propylene glycol monoethyl ether acetate, and isopropanol. The relief image is then converted to a patterned polyimide film by applying heat at temperatures ranging from 200 to 425° C. for times ranging from 30 minutes to six hours.

EXAMPLE 1

A negative resist composition, prepared by mixing:

| | |
|---|---|
| 37.03 wt. % | Polyamic acid ester (component C) produced from 4,4'-oxydiphthalic anhydride (=ODPA), 4,4'-diaminophenyl ether (=ODA) and 2-hydroxyethyl methacrylate (R') |
| 1.3 wt. % | Titanocene corresponding to Formula 3 (component D) |
| 5.36 wt. % | Tetraethylene glycol dimethacrylate (component E) |
| 0.05 wt. % | 1H-tetrazole (component F) |
| 0.07 wt. % | Para-benzoquinone (component G) |
| 0.74 wt % | Silane adhesion promoter (component J) |
| 55.25 wt. % | N-methylpyrrolidone (component H) | was rolled overnight to yield a clear resin solution and was then subjected to a pressure filtration through filters of pore width 0.2 microns. The resin solution was spin coated onto bare silicon and -coated silicon wafers and then dried on a hot plate for 7 minutes at 100° C. In this way, 11 μm thick films of uniform thickness were obtained on the wafers. The wafers were then exposed to monochromatic light with a wavelength of 365 nanometers using a Canon 3000i i-line stepper exposure tool. After exposure, the image was developed by rotating the wafer at 1000 rpm and then spraying the wafer with cyclopentanone for 35 seconds, followed by spraying the wafer simultaneously with equal volumes of cyclopentanone and propylene glycol monomethylether acetate (PGMEA) for 10 seconds at 1000 rpm, and then spraying with pure PGMEA for 15 seconds. As a final step, the wafers were spun at 3000 rpm until dry. High quality relief images were obtained on both the silicon and copper-coated silicon wafers. The exposure dose required to obtain 90% retained film thickness after development on both substrates was 300 mJ/cm$^2$.

EXAMPLE 2

A negative resist composition, prepared by mixing:

| | |
|---|---|
| 37.34 wt. % | Polyamic acid ester (component C) produced from 4,4'-oxydiphthalic anhydride (=ODPA), 4,4'-diaminophenyl ether (=ODA) and 2-hydroxyethyl methacrylate (R') |
| 6.54 wt. % | A 20% NMP solution of titanocene corresponding to Formula 4 (component D) |
| 5.61 wt. % | Tetraethylene glycol dimethacrylate (component E) |
| 0.05 wt. % | 1H-tetrazole (component F) |
| 0.07 wt. % | Para-benzoquinone (component G) |
| 0.74 wt % | Silane adhesion promoter (component J) |
| 49.64 wt. % | N-methylpyrrolidone (component H) | was rolled overnight to yield a clear resin solution and was then subjected to a pressure filtration through filters of pore width 0.2 microns. The resin solution was spin coated onto bare silicon and copper-coated silicon wafers and then dried on a hot plate for 7 minutes at 100° C. In this way, 11 μm thick films of uniform thickness were obtained on the wafers. The wafers were then exposed to monochromatic light with a wavelength of 365 nanometers using a Canon 3000i i-line stepper exposure tool. After exposure, the image was developed by rotating the wafers at 1000 rpm and then spraying the wafer with cyclopentanone for 35 seconds, followed by spraying the wafer s simultaneously with equal volumes of cyclopentanone and propylene glycol monomethylether acetate (PGMEA) for 10 seconds at 1000 rpm, and then spraying with pure PGMEA for 15 seconds. As a final step, the wafers were spun at 3000 rpm until dry. High quality relief images were obtained on both the silicon and copper coated silicon wafers. The exposure energy resulting in 90% retained film thickness was 120 mJ/cm$^2$ for the silicon wafer and 140 mJ/cm$^3$ for the copper wafers.

EXAMPLE 3

A negative resist composition, prepared by mixing:

| | |
|---|---|
| 26.44 wt. % | Polyamic acid ester (component C) produced from 4,4'-oxydiphthalic anhydride (=ODPA), 4,4'-diaminophenyl ether (=ODA) and 2-hydroxyethyl methacrylate (R') |
| 0.93 wt. % | Titanocene corresponding to Formula 3 (component D) |
| 3.97 wt. % | Tetraethylene glycol dimethacrylate (component E) |
| 0.034 wt. % | 1,2-cyclohexanediamine tetraacetic acid hydrate (component F) |
| 0.053 wt. % | para-benzoquinone (component G) |
| 0.08 wt. % | CDAC (component I) |
| 0.53 wt % | Silane adhesion promoter (component J) |
| 33.98 wt. % | Cyclopentanone (component H) |
| 33.98 wt. % | N-methylpyrrolidone (component H) | was rolled overnight to yield a clear resin solution and was then subjected to a pressure filtration. The resin solution was spin coated onto a silver-coated silicon wafer and then dried on a hot plate for 2 minutes at 110° C. In this way, a 4.5 μm thick film of uniform thickness were obtained on the wafer. The wafer was then exposed to broadband radiation using a Karl Suss MA 56 contact exposure tool at an energy dose of 300 mJ/cm$^2$. After exposure, the image was developed by rotating the wafer at 1000 rpm and then spraying the wafer with cyclopentanone for 10 seconds, followed by spraying the wafer simultaneously with equal volumes of cyclopentanone and propylene glycol monomethylether acetate (PGMEA) for 10 seconds at 1000 rpm, and then spraying with pure PGMEA for 10 seconds. As a final step, the wafers were spun at 3000 rpm until dry. High quality relief images were obtained on the silver coated wafer with a film thickness retention of 70%.

EXAMPLE 4

A negative resist composition, prepared by mixing:

| | |
|---|---|
| 38.28 wt. % | Polyamic acid ester (component C) produced from pyromellitic dianhydride (=PMDA), 4,4'-diaminophenyl ether (=ODA) and 2-hydroxyethyl methacrylate (R') |
| 6.70 wt. % | A 20% NMP solution of titanocene corresponding to Formula 4 (component D) |
| 5.74 wt. % | Tetraethylene glycol dimethacrylate (component E) |
| 0.05 wt. % | 1H-tetrazole (component F) |
| 0.08 wt. % | Para-benzoquinone (component G) |
| 0.76 wt % | Silane adhesion promoter (component J) |
| 48.39 wt. % | N-methylpyrrolidone (component H) | was rolled overnight to yield a clear resin solution and was then subjected to a pressure filtration through filters of pore width 0.2 microns. The resin solution was spin coated onto bare silicon and copper-coated silicon wafers and the wafers were dried on a hot plate for 6 minutes at 105° C. In this way, 15 to 17 μm thick polymer layers of uniform thickness were obtained on the wafers. The wafers were then exposed to broadband radiation using a Karl Suss MA 56 contact exposure tool at an energy dose of 200 mJ/cm$^2$. After exposure, the image was developed by rotating the wafer at 1300 rpm and then spraying the wafer with QZ-3501 for 40 seconds, followed by spraying the wafer simultaneously with equal volumes of QZ-3501 and propylene glycol monomethylether acetate (PGMEA) for 15 seconds at 3000 rpm, and then spraying with pure PGMEA for 15 seconds at 1300 rpm. As a final step, the wafers were spun at 3000 rpm until dry. High quality relief images were obtained on both the silicon and copper-coated wafers.

EXAMPLE 5

A negative resist composition, prepared by mixing:

| | |
|---|---|
| 38.28 wt. % | Polyamic acid ester (component C) produced from pyromellitic dianhydride (=PMDA), 4,4'-diaminophenyl ether (=ODA) and 2-hydroxyethyl methacrylate (R') |
| 1.34 wt. % | Titanocene corresponding to Formula 3 (component D) |
| 5.74 wt. % | Tetraethylene glycol dimethacrylate (component E) |
| 0.05 wt. % | 1H-tetrazole (component F) |
| 0.08 wt. % | Para-benzoquinone (component G) |
| 0.76 wt % | Silane adhesion promoter (component J) |
| 53.75 wt. % | N-methylpyrrolidone (component H) | was rolled overnight to yield a clear resin solution and was then subjected to a pressure filtration through filters of pore width 0.2 microns. The resin solution was spin coated onto a Cu-coated silicon wafers and then dried on a hot plate for 10 minutes at 105° C. In this way, 30 to 35 μm thick polymer layers of uniform thickness were obtained on the wafers. The wafers was then exposed to broadband radiation using a Karl Suss MA 56 contact exposure tool at an energy dose of 500 mJ/cm². After exposure, the image was developed by rotating the wafer at 1300 rpm and then spraying the wafer with QZ-3501 for 80 seconds, followed by spraying the wafer simultaneously with equal volumes of QZ-3501 and propylene glycol monomethylether acetate (PGMEA) for 15 seconds at 3000 rpm, and then spraying with pure PGMEA for 15 seconds at 1300 rpm. As a final step, the wafers were spun at 3000 rpm until dry. High quality relief images were obtained on the copper-coated silicon wafers. The exposure energy of 500 mJ/cm² resulted in a film retention after develop of 89.1% from the original softbaked film thickness.

COMPARATIVE EXAMPLE 1

A negative resist composition, prepared by mixing:

| | |
|---|---|
| 37.01 wt.% | Polyamic acid ester (component C) produced from 4,4'-oxydiphthalic anhydride (=ODPA), 4,4'-diaminophenyl ether (=ODA) and 2-hydroxyethyl methacrylate (R') |
| 1.3 wt. % | Titanocene corresponding to Formula 3 (component D) |
| 5.56 wt. % | Tetraethylene glycol dimethacrylate (component E) |
| 0.07 wt. % | Para-benzoquinone (component G) |
| 0.74 wt % | Silane adhesion promoter (component J) |
| 55.32 wt. % | N-methylpyrrolidone (component H) | was rolled overnight to yield a clear resin solution and was then subjected to a pressure filtration through filters of pore width 0.2 microns. The resin solution was spin coated onto bare silicon and copper-coated silicon wafers and then dried on a hot plate for 8 minutes at 105° C. In this way, 20 μm thick polymer layers of uniform thickness were obtained on the wafers. The wafers were then exposed to monochromatic light with a wavelength of 365 nanometers using a Canon 3000i i-line stepper exposure tool. After exposure, the image was developed by rotating the wafer at 1000 rpm and then spraying the wafer with cyclopentanone for 70 seconds, followed by spraying the wafer simultaneously with equal volumes of cyclopentanone and n-butyl acetate (NBA) for 15 seconds at 1000 rpm, and then spraying with pure NBA for 10 seconds. As a final step, the wafers were spun at 3000 rpm until dry. High quality relief images were obtained on the silicon wafers with a film thickness retention of 91% at an exposure energy of 410 mJ/cm² . The copper wafers showed very poorly defined patterns with poor adhesion and substantial film loss with a film thickness retention of 17%.

COMPARATIVE EXAMPLE 2

A negative resist composition, prepared by mixing:

| | |
|---|---|
| 33.94 wt. % | Polyamic acid ester (component C) produced from 4,4'-oxydiphthalic an hydride (=ODPA), 4,4'-diaminophenyl ether (=ODA) and 2-hydroxyethyl methacrylate (R') |
| 5.90 wt. % | A 20% NMP solution of titanocene corresponding to Formula 4 (component D) |
| 5.10 wt. % | Tetraethylene glycol dimethacrylate (component E) |
| 0.07 wt. % | Para-benzoquinone (component G) |
| 0.68 wt % | Silane adhesion promoter (component J) |
| 54.31 wt. % | N-methylpyrrolidone (component H) | was rolled overnight to yield a clear resin solution and was then subjected to a pressure filtration through filters of pore width 0.2 microns. The resin solution was spin coated onto silicon and copper-coated silicon wafers and then dried on a hot plate for 5 minutes at 100° C. In this way, 10 μm thick polymer layers of uniform thickness were obtained on the wafers. The wafers were then exposed to broadband radiation illumination using a Karl Suss MA 56 contact exposure tool. After exposure, the image was developed by rotating the wafer at 1000 rpm and then spraying the wafer with cyclopentanone for 30 seconds, followed by spraying the wafer simultaneously with equal volumes of cyclopentanone and propylene glycol monomethylether acetate (PGMEA) for 10 seconds at 1000 rpm, and then spraying with pure PGMEA for 15 seconds. As a final step, the wafers were spun at 2000 rpm for 30 seconds until dry. High quality relief images with 90% film were obtained on the silicon wafers while the copper-coated wafers showed only 10% film retention and very poor pattern definition and loss of adhesion.

COMPARATIVE EXAMPLE 3

A negative resist composition, prepared by mixing:

| | |
|---|---|
| 38.30 wt. % | Polyamic acid ester (component C) produced from pyromellitic dianhydride (=PMDA), 4,4'-diaminophenyl ether (=ODA) and 2-hydroxyethyl methacrylate (R') |
| 6.70 wt. % | A 20% NMP solution of titanocene corresponding to Formula 4 (component D) |
| 5.74 wt. % | Tetraethylene glycol dimethacrylate (component E) |
| 0.08 wt. % | Para-benzoquinone (component G) |
| 0.76 wt % | Silane adhesion promoter (component J) |
| 48.42 wt. % | N-methylpyrrolidone (component H) | was rolled overnight to yield a clear resin solution and was then subjected to a pressure filtration through filters of pore width 0.2 microns. The resin solution was spin coated onto bare silicon and copper-coated wafers and then dried on a hot plate for 6 minutes at 105° C. In this way, 15–17 μm thick polymer layers of uniform thickness were obtained on the wafers. The wafers were then exposed to broadband radiation using Karl Suss MA56 contact exposure tool at an energy dose of 200 mJ/cm². After exposure, the image was developed by rotating the wafer at 1300 rpm and then spraying the wafer with QZ 3501 for 40 seconds, followed by spraying the wafer simultaneously with equal volumes of QZ 3501 and propylene glycol monomethylether acetate (PGMEA) for 15 seconds at 3000 rpm, and then spraying with pure PGMEA for 15 seconds at 1300 rpm. As a final step, the wafers were spun at 3000 rpm until dry. High quality relief images were obtained on the silicon wafers while the copper-coated wafers showed very poor pattern definition, poor adhesion, and almost no film retention.

With the foregoing description of the invention, those skilled in the art will appreciate that modifications can be made to the invention without departing from the spirit and scope thereof. Therefore, it is not intended the scope of the invention be limited to the specific embodiments illustrated and described.

We claim:

1. A photosensitive polyimide precursor composition comprising:

a polyamic ester polymer obtained by polycondensation of at least one diester diacid chloride compound with at least one diamine compound;

a titanocene photoinitiator;

a photocrosslinkable additive;

a metal inhibitor selected from 1H-tetrazole, 1,2-cyclohexanediamine tetraacetic acid hydrate and 5-mercaptobenzimidazole;

a polymerization inhibitor;

a solvent; and optionally one or more of:

at least one photosensitizer compound, and at least one adhesion promoting compound.

2. A photosensitive polyimide precursor composition according to claim 1 wherein the titanocene photoinitiator is selected from bis(.eta.5-2,4-cyclopentadien-1-yl)-bis(2,6-difluoro-3-(1H-pyrrol-1-yl)phenyl)titanium and bis(methylcyclopentadienyl)-bis(2,6-difluorophen-1-yl) titanium.

3. In a process for photochemical crosslinking of a photosensitive polyimide precursor composition in the presence of a titanocene photoinitiator and a metal selected from copper and silver, the improvement comprising reducing inhibition of the photochemical crosslinking by including in the photosensitive polyimide precursor composition a metal inhibitor selected from 1H-tetrazole, 1,2-cyclohexenediamine tetraacetic acid hydrate and 5-mercaptobenzimidazole.

4. In a process for reducing the inhibition of photochemical crosslinking of a photosensitive polyimide precursor composition in the presence of a metal selected from copper and silver, the improvement comprising photochemically crosslinking a polyimide precursor composition according to claim 1.

5. In a process for reducing the inhibition of photochemical crosslinking of a photosensitive polyimide precursor composition in the presence of a metal selected from copper and silver, the improvement comprising photochemically crosslinking a polyimide precursor composition according to claim 2.

* * * * *